United States Patent
Tapily

(10) Patent No.: US 11,658,068 B2
(45) Date of Patent: May 23, 2023

(54) METHOD OF SELECTIVE DEPOSITION FOR FORMING FULLY SELF-ALIGNED VIAS

(71) Applicant: Tokyo Electron Limited, Tokyo (JP)

(72) Inventor: Kandabara Tapily, Albany, NY (US)

(73) Assignee: Tokyo Electron Limited, Tokyo (JP)

( * ) Notice: Subject to any disclaimer, the term of this patent is extended or adjusted under 35 U.S.C. 154(b) by 183 days.

(21) Appl. No.: 17/102,054

(22) Filed: Nov. 23, 2020

(65) Prior Publication Data

US 2021/0074584 A1 Mar. 11, 2021

Related U.S. Application Data

(62) Division of application No. 16/193,833, filed on Nov. 16, 2018, now Pat. No. 10,847,363.

(Continued)

(51) Int. Cl.
*H01L 21/768* (2006.01)
*H01L 21/02* (2006.01)
(Continued)

(52) U.S. Cl.
CPC ........ *H01L 21/76897* (2013.01); *C23C 16/00* (2013.01); *H01L 21/022* (2013.01); *H01L 21/0228* (2013.01); *H01L 21/02074* (2013.01); *H01L 21/02164* (2013.01); *H01L 21/02178* (2013.01); *H01L 21/02181* (2013.01); *H01L 21/02189* (2013.01); *H01L 21/02214* (2013.01); *H01L 21/02216* (2013.01); *H01L 21/02274* (2013.01); *H01L 21/02277* (2013.01);
(Continued)

(58) Field of Classification Search
CPC ......... H01L 21/76897; H01L 21/02164; H01L 21/0228; H01L 21/3105; H01L 21/68764
USPC .......................................................... 257/790
See application file for complete search history.

(56) References Cited

U.S. PATENT DOCUMENTS 8,758,584 B2 * 6/2014 Kahn ................. G01N 27/4167
324/438
10,049,913 B2    8/2018 Tapily
(Continued)

FOREIGN PATENT DOCUMENTS

| JP | 2015149434 | 8/2015 |
| KR | 20150092022 A | 8/2015 |
| WO | 2016138284 A1 | 9/2016 |

OTHER PUBLICATIONS

Japan Patent Office, Notice of Reason(s) for Rejection for Japanese application No. 2018-216745, dated Nov. 8, 2022, 4pages.
(Continued)

*Primary Examiner* — Jami Valentine Miller

(57) ABSTRACT

Methods are provided for selective film deposition. One method includes providing a substrate containing a dielectric material and a metal layer, the metal layer having an oxidized metal layer thereon, coating the substrate with a metal-containing catalyst layer, treating the substrate with an alcohol solution that removes the oxidized metal layer from the metal layer along with the metal-containing catalyst layer on the oxidized metal layer, and exposing the substrate to a process gas containing a silanol gas for a time period that selectively deposits a $SiO_2$ film on the metal-containing catalyst layer on the dielectric material.

20 Claims, 6 Drawing Sheets

Related U.S. Application Data

(60) Provisional application No. 62/685,847, filed on Jun. 15, 2018, provisional application No. 62/588,855, filed on Nov. 20, 2017.

(51) Int. Cl.
| | | |
|---|---|---|
| *H01L 21/677* | (2006.01) | |
| *H01L 21/67* | (2006.01) | |
| *C23C 16/00* | (2006.01) | |
| *H01L 21/3105* | (2006.01) | |
| *H01L 21/321* | (2006.01) | |
| *H01L 21/687* | (2006.01) | |
| *H01L 21/32* | (2006.01) | |

(52) U.S. Cl.
CPC .. *H01L 21/02301* (2013.01); *H01L 21/02304* (2013.01); *H01L 21/02312* (2013.01); *H01L 21/3105* (2013.01); *H01L 21/321* (2013.01); *H01L 21/67196* (2013.01); *H01L 21/67201* (2013.01); *H01L 21/67742* (2013.01); *H01L 21/32* (2013.01); *H01L 21/68764* (2013.01); *H01L 21/68771* (2013.01)

(56) References Cited

U.S. PATENT DOCUMENTS

| | | | |
|---|---|---|---|
| 10,068,764 | B2 | 9/2018 | Tapily et al. |
| 10,453,749 | B2 | 10/2019 | Tapily et al. |
| 10,468,585 | B1* | 11/2019 | Nguyen ................ H01L 27/222 |
| 10,847,363 | B2 | 11/2020 | Tapily |
| 2008/0032064 | A1 | 2/2008 | Gordon et al. |
| 2008/0095816 | A1* | 4/2008 | Gordy ..................... C08L 83/04 424/422 |
| 2011/0248970 | A1* | 10/2011 | Koyama ............... G09G 3/3426 345/204 |
| 2015/0004806 | A1* | 1/2015 | Ndiege ................ C23C 16/401 438/789 |
| 2015/0217330 | A1 | 8/2015 | Haukka et al. |
| 2016/0064275 | A1 | 3/2016 | Liu et al. |
| 2016/0064284 | A1 | 3/2016 | Caimi et al. |
| 2017/0114451 | A1* | 4/2017 | Lecordier ......... C23C 16/45525 |
| 2017/0259298 | A1 | 9/2017 | Woodruff et al. |
| 2018/0076027 | A1* | 3/2018 | Tapily ............... H01L 21/31111 |

OTHER PUBLICATIONS

Taiwan Patent Office, Notification of Examination Opinions for Taiwan application No. 107141020, dated Mar. 30, 2022, 6 pages.

Korean Intellectual Patent Office, Office Action for Korean application No. 10-2018-0143516, dated Jul. 20, 2022, 19 pages.

Korean Intellectual Patent Office, Office Action for Korean application No. 10-2022-0116934, dated Dec. 26, 2022, 4 pages.

\* cited by examiner

METHOD OF SELECTIVE DEPOSITION FOR FORMING FULLY SELF-ALIGNED VIAS

CROSS-REFERENCE TO RELATED APPLICATIONS

The present application is a Divisional of U.S. patent application Ser. No. 16/193,833, filed Feb. 1, 2017, currently granted as U.S. Pat. No. 10,847,363, which claims the benefit of U.S. Provisional Patent Application No. 62/588,855 filed on Nov. 20, 2017, and U.S. Provisional Patent Application Ser. No. 62/685,847 filed on Jun. 15, 2018, the entire contents of which are herein incorporated by reference.

FIELD OF THE INVENTION

The present invention relates to semiconductor processing and semiconductor devices, and more particularly, to methods for selective film deposition using a surface pretreatment.

BACKGROUND OF THE INVENTION

As device size is getting smaller, the complexity in semiconductor device manufacturing is increasing. The cost to produce the semiconductor devices is also increasing and cost effective solutions and innovations are needed. As smaller transistors are manufactured, the critical dimension (CD) or resolution of patterned features is becoming more challenging to produce. Selective deposition of thin films is a key step in patterning in highly scaled technology nodes. New deposition methods are required that provide selective film deposition on different material surfaces.

SUMMARY OF THE INVENTION

Embodiments of the invention provide methods for selective film deposition using a surface pretreatment.

According to one embodiment, the method includes providing a substrate containing a dielectric material and a metal layer, the metal layer having an oxidized metal layer thereon, coating the substrate with a metal-containing catalyst layer, treating the substrate with an alcohol solution that removes the oxidized metal layer from the metal layer along with the metal-containing catalyst layer on the oxidized metal layer, and exposing the substrate to a process gas containing a silanol gas for a time period that selectively deposits a $SiO_2$ film on the metal-containing catalyst layer on the dielectric material.

According to another embodiment of the invention, the method includes providing a substrate containing a dielectric material and a metal layer, the metal layer having an oxidized metal layer thereon, exposing the substrate to a reactant gas containing a molecule that forms self-assembled monolayers (SAMs) on the substrate, and selectively depositing a metal oxide film on the dielectric material relative the oxidized metal layer by exposing the substrate to a deposition gas, and exposing the substrate to a process gas containing a silanol gas for a time period that selectively deposits a silicon oxide ($SiO_2$) film on the metal oxide film According to another embodiment of the invention, the method includes providing a substrate containing a dielectric material and a metal layer, the metal layer having an oxidized metal layer thereon, exposing the substrate to hydrogen gas excited by a plasma source, selectively depositing a metal oxide film on the dielectric material by exposing the substrate to a deposition gas, and exposing the substrate to a process gas containing a silanol gas for a time period that selectively deposits a $SiO_2$ film on the metal oxide film.

BRIEF DESCRIPTION OF THE DRAWINGS

A more complete appreciation of embodiments of the invention and many of the attendant advantages thereof will become readily apparent with reference to the following detailed description, particularly when considered in conjunction with the accompanying drawings, in which.

DETAILED DESCRIPTION OF SEVERAL EMBODIMENTS

Embodiments of the invention provide methods for effective surface pretreatments for selectively depositing silicon oxide films and dielectric laminate films on dielectric materials relative to metal layers.

Figure 1A:
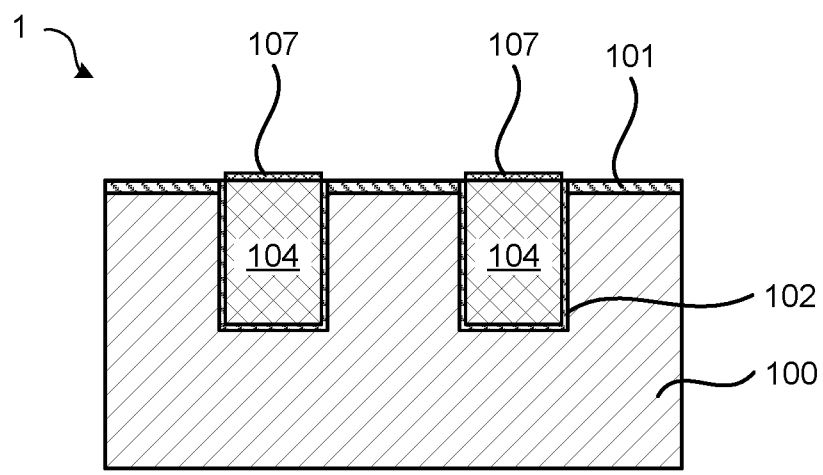
FIGS. 1A-1D show through schematic cross-sectional views a method of selectively depositing a $SiO_2$ film on a substrate according to an embodiment of the invention.

FIGS. 1A-1D show through schematic cross-sectional views a method of selectively depositing a $SiO_2$ film on a substrate according to an embodiment of the invention. In FIG. 1A, the patterned substrate 1 contains a dielectric material 100, a dielectric material 101 on the dielectric material 100, a metal layer 104 inlaid in the dielectric material 100, an oxidized metal layer 107 on the metal layer 104, and a diffusion barrier layer 102 separating the metal layer 104 from the dielectric material 100. The metal layer 104 can, for example, contain copper (Cu), ruthenium (Ru), cobalt (Co), or tungsten (W). The oxidized metal layer 107 can, for example, contain oxidized Cu, oxidized Ru, oxidized Co, or oxidized W. The dielectric material 100 can, for example, contain a low-k dielectric material, $SiO_2$, or a metal-containing dielectric material. For example, the metal-containing dielectric material can contain a metal oxide, a metal nitride, or a metal oxynitride. In some examples, the diffusion barrier layer 102 can contain TaN, TiN, TaSiN, or TiSiN. The dielectric material 101 may be used as an etch stop layer in a chemical mechanical planarization (CMP) process to planarize the substrate 1 as depicted in FIG. 1A. The dielectric material 101 may contain SiCN or SiOC. In one example, the dielectric material 101 may contain the same material as the dielectric material 100. The oxidized metal layer 107 may form by exposure of the metal layer 104 to oxygen-containing gases during substrate processing, including exposures of $O_2$ and $H_2O$ from processing gases or background gases in the processing system(s). In one example, the oxidized metal layer 107 may form during or following a CMP process. In one example, the oxidized metal layer 107 may be incomplete with open areas that expose the metal layer 104.

According to an embodiment of the invention, a method is provided for selective deposition of a $SiO_2$ film on the dielectric material 101 relative to the oxidized metal layer 107 or the metal layer 104. The presence of the oxidized metal layer 107 can affect the selective SiO$_2$ film deposition by reducing the deposition selectivity. Therefore, a substrate pretreatment is provided that efficiently removes the oxidized metal layer 107 from the metal layer 104, where the substrate pretreatment can be integrated into a method of selective SiO$_2$ film deposition for forming fully self-aligned vias and other recessed features.

Figure 1B:
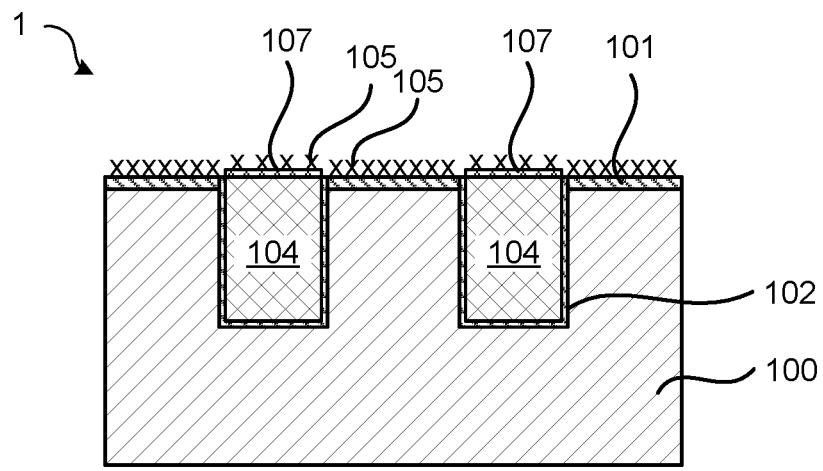

According to one embodiment, the substrate 1 in FIG. 1A is coated with a metal-containing catalyst layer 105. As schematically shown in FIG. 1B, a surface density of the metal-containing catalyst layer 105 ("X") on the oxidized metal layer 107 may be lower than on the dielectric material 100. In accordance with some embodiments of the invention, the metal-containing catalyst layer 105 may comprise aluminum (Al), titanium (Ti), or both aluminum and titanium. The metal-containing catalyst layer 105 may be selected from the group consisting of Al, Al$_2$O$_3$, AlN, AlON, an Al-containing precursor, an Al-containing alloy, CuAl, TiAlN, TaAlN, Ti, TiAlC, TiO$_2$, TiON, TiN, a Ti-containing precursor, a Ti-containing alloy, and combinations thereof. The metal-containing catalyst layer 105 may be formed by exposing the substrate 1 to a metal-containing precursor vapor and optionally an oxygen-containing gas and/or a nitrogen-containing gas. The exposing may proceed by exposing the substrate 1 to a gas pulse containing a metal that adsorbs a metal-containing catalyst layer 105 that is approximately one monolayer thick. In one example, the metal-containing catalyst layer 105 may include a layer of an adsorbed metal-containing precursor, e.g., AlMe$_3$.

Embodiments of the invention may utilize a wide variety of Al-containing precursors. For example, many aluminum precursors have the formula:

$$AlL^1L^2L^3D_x$$

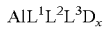

where L$^1$, L$^2$, L$^3$ are individual anionic ligands, and D is a neutral donor ligand where x can be 0, 1, or 2. Each L$^1$, L$^2$, L$^3$ ligand may be individually selected from the groups of alkoxides, halides, aryloxides, amides, cyclopentadienyls, alkyls, silyls, amidinates, β-diketonates, ketoiminates, silanoates, and carboxylates. D ligands may be selected from groups of ethers, furans, pyridines, pyrroles, pyrrolidines, amines, crown ethers, glymes, and nitriles.

Other examples of aluminum precursors include: AlMe$_3$, AlEt$_3$, AlMe$_2$H, [Al(OsBu)$_3$]$_4$, Al(CH$_3$COCHCOCH$_3$)$_3$, AlCl$_3$, AlBr$_3$, AlI$_3$, Al(OiPr)$_3$, [Al(NMe$_2$)$_3$]$_2$, Al(iBu)$_2$Cl, Al(iBu)$_3$, Al(iBu)$_2$H, AlEt$_2$Cl, Et$_3$Al$_2$(OsBu)$_3$, and Al(THD)$_3$.

Embodiments of the invention may utilize a wide variety of Ti-containing precursors. Examples include Ti-containing precursors having "Ti—N" intra-molecular bonds include Ti(NEt$_2$)$_4$ (TDEAT), Ti(NMeEt)$_4$ (TEMAT), Ti(NMe$_2$)$_4$ (TDMAT). Other examples include Ti-containing precursors containing "Ti—C" intra-molecular bonds include Ti(COCH$_3$)(η$^5$-C$_5$H$_5$)$_2$Cl, Ti(η$^5$-C$_5$H$_5$)Cl$_2$, Ti(η$^5$-C$_5$H$_5$)Cl$_3$, Ti(η$^5$-C$_5$H$_5$)$_2$Cl$_2$, Ti(η$^5$-C$_5$(CH$_3$)$_5$)Cl$_3$, Ti(CH$_3$)(η$^5$-C$_5$H$_5$)$_2$Cl, Ti(η$^5$-C$_9$H$_7$)$_2$Cl$_2$, Ti((η$^5$-C$_5$(CH$_3$)$_5$)$_2$Cl, Ti((η$^5$-C$_5$(CH$_3$)$_5$)$_2$Cl$_2$, Ti(η$^5$-C$_5$H$_5$)$_2$(η$^5$-Cl)$_2$, Ti(η$^5$-C$_5$H$_5$)$_2$(CO)$_2$, Ti(CH$_3$)$_3$(η$^5$-C$_5$H$_5$), Ti(CH$_3$)$_2$(η$^5$-C$_5$H$_5$)$_2$, Ti(CH$_3$)$_4$, Ti(η$^5$-C$_5$H$_5$)(η$^7$-C$_7$H$_7$), Ti(η$^5$-C$_5$H$_5$)(η$^8$-C$_8$H$_8$), Ti(C$_5$H$_5$)$_2$(η$^5$-C$_5$H$_5$)$_2$, Ti((C$_5$H$_5$)$_2$)$_2$(η-H)$_2$, Ti(η$^5$-C$_5$(CH$_3$)$_5$)$_2$, Ti(η$^5$-C$_5$(CH$_3$)$_5$)$_2$(H)$_2$, and Ti(CH$_3$)$_2$(η$^5$-C$_5$(CH$_3$)$_5$)$_2$. TiCl$_4$ is an example of a titanium halide precursor containing a "Ti-halogen" bond.

Figure 1C:
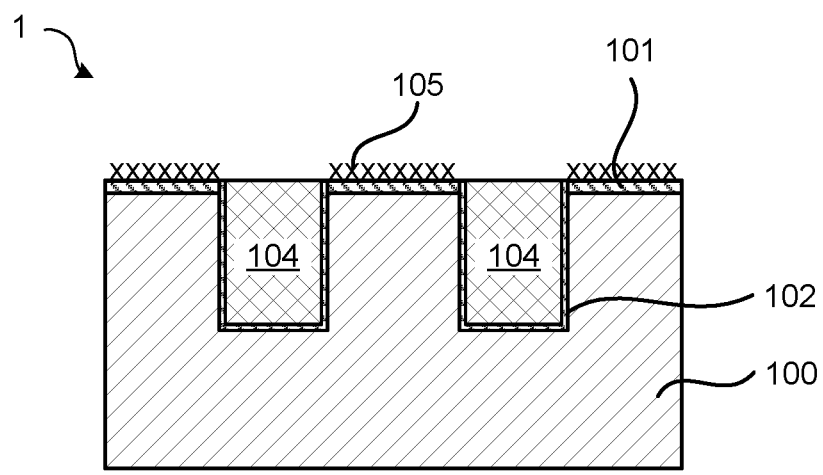

The processing method further includes treating the substrate 1 in FIG. 1B with an alcohol solution that removes the oxidized metal layer 107 and the metal-containing catalyst layer 105 from the metal layer 104. This is schematically shown in FIG. 1C, where the metal-containing catalyst layer 105 only remains on the dielectric material 101. The inventors have discovered that an alcohol solution that comes in contact with the substrate 1, effectively lifts off the oxidized metal layer 107 without reoxidizing the underlying metal layer 104, and further removes the metal-containing catalyst layer 105 in the lift-off process, since the metal-containing catalyst layer 105 is bonded to the oxidized metal layer 107 that is being removed. In one example, the alcohol solution may be contacted with the substrate 1 at room temperature. The alcohol solution may consist of one or more alcohols or, alternatively, the alcohol solution may consist of one or more alcohols and a non-oxidizing solvent. The alcohol solution can contain any alcohol with a chemical formula R—OH. One class of alcohols is primary alcohols, of which methanol and ethanol are the simplest members. Another class of alcohols is secondary alcohols, for example isopropyl alcohol (IPA).

Figure 1D:
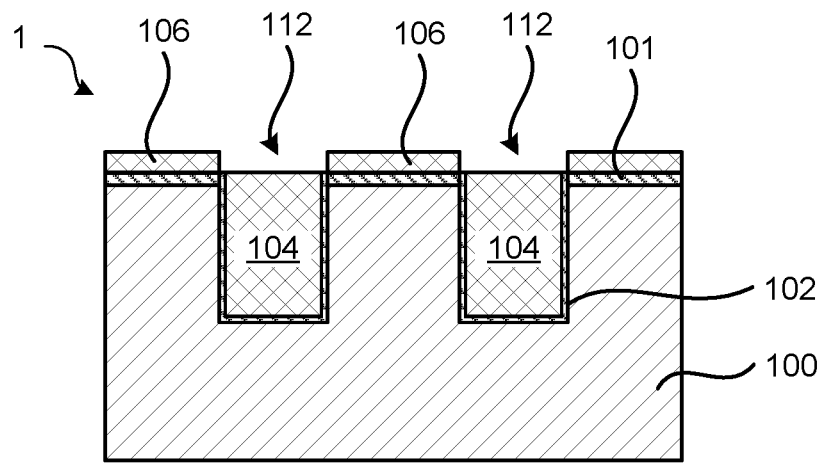

The processing method further includes exposing the substrate 1 to a process gas containing a silanol gas for a time period that selectively deposits a SiO$_2$ film 106 in a self-limiting way on the metal-containing catalyst layer 105 on the dielectric material 101 and not on the metal layer 104. This is schematically shown in FIG. 1D.

The metal-containing catalyst layer 105 catalyzes the selective deposition of the SiO$_2$ film 106 from the silanol gas, and this catalytic effect is observed until the deposited SiO$_2$ film 106 is about 15 nm thick or less, and then the SiO$_2$ deposition automatically stops when no catalytic sites on the substrate 1 remain. The exposure to the process gas may be carried out for a time period that does not result in significant SiO$_2$ deposition on the metal layer 104. According to embodiments of the invention, the substrate 1 is exposed to the process gas containing a silanol gas in the absence of any oxidizing and hydrolyzing agent. In one example, the silanol gas may be selected from the group consisting of tris(tert-pentoxy) silanol (TPSOL), tris(tert-butoxy) silanol, and bis(tert-butoxy)(isopropoxy) silanol.

The process gas may further contain an inert gas such as Argon. In one example, the process gas may consist of a silanol gas and an inert gas. The substrate temperature may be approximately 150° C., or less, during the exposing. In another embodiment, the substrate temperature may be approximately 120° C., or less. In yet another embodiment, the substrate temperature may be approximately 100° C., or less.

According to embodiments of the invention, the steps of coating the substrate 1 with a metal-containing catalyst layer 105, treating the substrate 1 with an alcohol solution to remove the metal-containing catalyst layer 105 from the metal layer 104, and exposing the substrate 1 to a process gas containing a silanol gas may be repeated one or more times to increase the thickness of the SiO$_2$ film 106. As seen in FIG. 1D, the SiO$_2$ film 106 forms fully self-aligned vias 112 above the metal layers 104. The fully self-aligned vias 112 may also be referred to as holes or trenches.

Figure 2A:
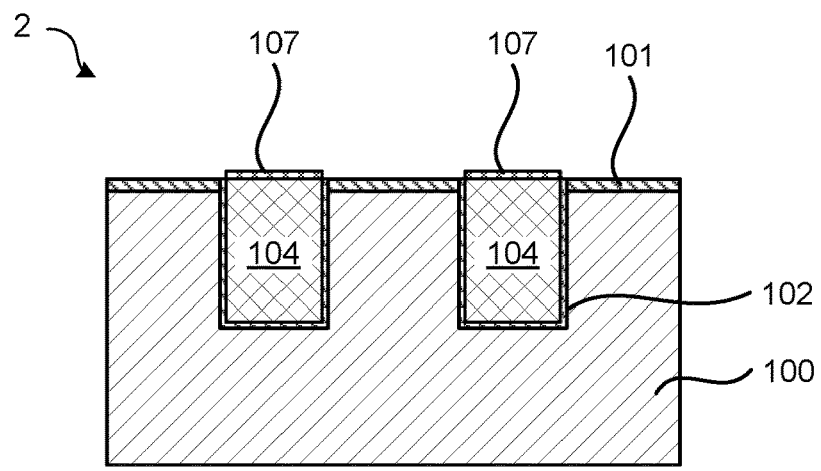
FIGS. 2A-2E show through schematic cross-sectional views a method of selectively depositing a dielectric laminate film on a substrate according to an embodiment of the invention.
Figure 2B:
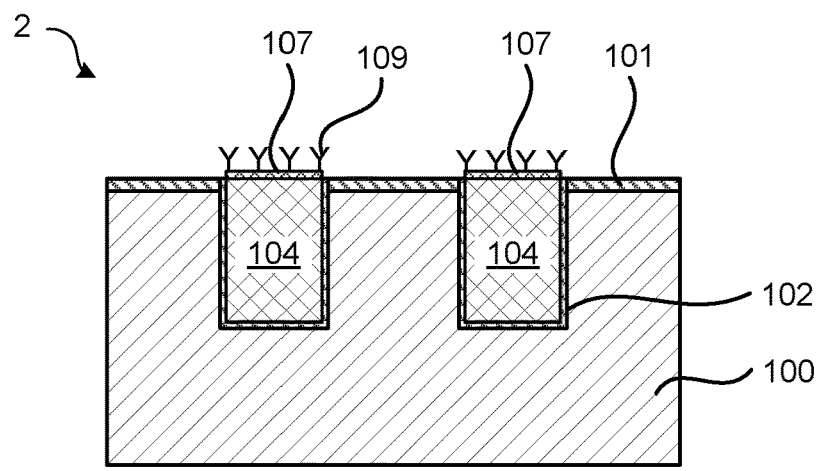

FIGS. 2A-2E show through schematic cross-sectional views a method of selectively depositing a dielectric laminate film on a substrate according to an embodiment of the invention. The substrate 1 from FIG. 1A has been reproduced as substrate 2 in FIG. 2A. According to one embodiment, the substrate 2 in FIG. 2A is pretreated by exposure to a reactant gas that contains a molecule that is capable of forming self-assembled monolayers (SAMs) on the substrate 2. FIG. 2B schematically shows SAMs 109 ("Y") on the oxidized metal layer 107. SAMs are molecular assemblies that are spontaneously formed on substrate surfaces by adsorption and are organized into more or less large ordered domains. The SAMs can include a molecule that possesses a head group, a tail group, and a functional end group, and SAMs are created by the chemisorption of head groups onto the substrate from the vapor phase at room temperature or above room temperature, followed by a slow organization of the tail groups. Initially, at small molecular density on the surface, adsorbate molecules form either a disordered mass of molecules or form an ordered two-dimensional "lying down phase", and at higher molecular coverage, over a period of minutes to hours, begin to form three-dimensional crystalline or semicrystalline structures on the substrate surface. The head groups assemble together on the substrate, while the tail groups assemble far from the substrate.

According to one embodiment, the head group of the molecule forming the SAMs can include a thiol, a silane, or a phosphonate. Examples of silanes include molecules that contain C, H, Cl, F, and Si atoms, or C, H, Cl, and Si atoms. Non-limiting examples of the molecule include perfluorodecyltrichlorosilane ($CF_3(CF_2)_7CH_2CH_2SiCl_3$), perfluorodecanethiol ($CF_3(CF_2)_7CH_2CH_2SH$), chlorodecyldimethylsilane ($CH_3(CH_2)_8CH_2Si(CH_3)_2Cl$), and tertbutyl(chloro) dimethylsilane (($CH_3)_3CSi(CH_3)_2Cl$)).

A pretreatment that forms the SAMs 109 on a substrate 2 may be used to enable subsequent selective metal oxide deposition on dielectric material surfaces relative to metal layer surfaces or oxidized metal layer surfaces. This selective deposition provides a method for selectively depositing metal oxide films on dielectric material surfaces while preventing or reducing metal oxide deposition on metal layer surfaces and oxidized metal layer surfaces. It is speculated that the SAM density is greater on the oxidized metal layer 107 compared to on the dielectric material 101, possible due to higher initial ordering of the molecules on the oxidized metal layer 107.

Figure 2C:
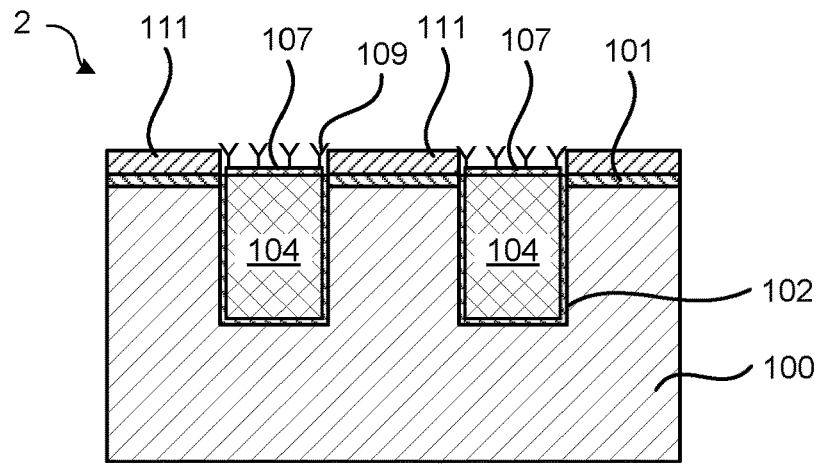

Following the pretreatment, a metal oxide film 111 is selectively deposited on dielectric material 101 relative to on the oxidized metal layer 107 by exposing the substrate 2 to a deposition gas. This is schematically shown in FIG. 2C. In one example, the metal oxide film 111 may contain $HfO_2$, $ZrO_2$, or $Al_2O_3$. The metal oxide film 111 may, for example, be deposited by ALD or plasma-enhanced ALD (PEALD). In some examples, the metal oxide film 111 may be deposited by ALD using alternating exposures of a metal-containing precursor and an oxidizer (e.g., $H_2O$, $H_2O_2$, plasma-excited $O_2$ or $O_3$).

Figure 2D:
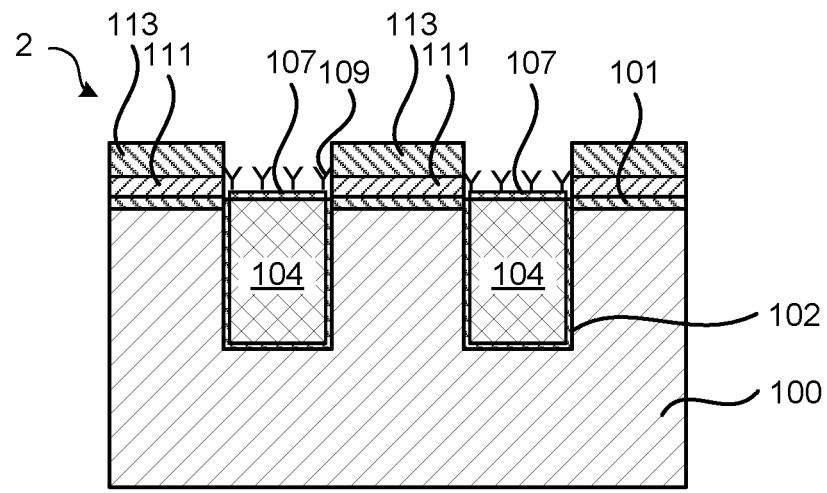

The processing method further includes exposing the substrate 2 to a process gas containing a silanol gas for a time period that selectively deposits a $SiO_2$ film 113 on the metal oxide film 111. This is schematically shown in FIG. 2D. In one example, the effective dielectric constant of the laminate that contains the metal oxide film 111 and the $SiO_2$ film 113 is less than about 7.

According to embodiments of the invention, the metal oxide film 111 catalyzes the selective deposition of a $SiO_2$ film 113 from the silanol gas, and this catalytic effect is observed until the deposited $SiO_2$ film 113 is about 15 nm thick or less, and then the $SiO_2$ deposition automatically stops. The exposure to the process gas may be carried out for a time period that does not result in significant $SiO_2$ deposition on the oxidized metal layer 107. According to embodiments of the invention, the substrate 2 is exposed to the process gas containing a silanol gas in the absence of any oxidizing and hydrolyzing agent. The silanol gas may be selected from the group consisting of tris(tert-pentoxy) silanol (TPSOL), tris(tert-butoxy) silanol, and bis(tert-butoxy)(isopropoxy) silanol.

In some examples, the process gas may further contain an inert gas such as Argon. In one embodiment, the process gas may consist of a silanol gas and an inert gas. Furthermore, according to one embodiment, the substrate temperature may be approximately 150° C., or less, during the exposing. In another embodiment, the substrate temperature may be approximately 120° C., or less. In yet another embodiment, the substrate temperature may be approximately 100° C., or less.

Figure 2E:
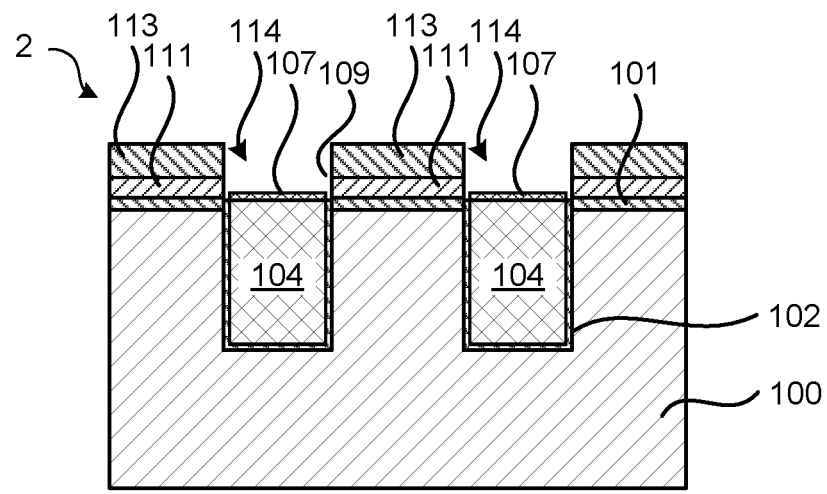

Thereafter, the SAMs 109 may be removed from the substrate 2 by a heat-treatment above about 300° C., by exposure to a hydrogen gas ($H_2$) excited by a plasma source, by exposure to an oxygen gas ($O_2$) excited by a plasma source, or a combination thereof. As seen in FIG. 2E, the $SiO_2$ film 113 and the metal oxide film 111 form fully self-aligned vias 114 above the metal layers 104. The fully self-aligned vias 114 may also be referred to as holes or trenches.

According to another embodiment, the SAM pretreatment may be replaced by an exposure to a hydrogen gas ($H_2$) excited by a plasma source that forms —H termination ("Y") on the oxidized metal layer 107 or on the metal layer 104. This is schematically shown in FIG. 2B. According to one embodiment, a chemical oxide removal (COR) process may be performed prior to the hydrogen gas exposure to remove the oxidized metal layer 107 from the substrate 2. The COR process includes exposing the substrate 2 to HF gas and $NH_3$ gas, and performing a heat-treatment. Following the COR process, the hydrogen gas exposure forms —H termination on the metal layer 104. The —H termination on the oxidized metal layer 107 or on the metal layer 104 can provide long incubation periods where initially little or no film deposition is observed on those layers. In contrast, film deposition with little or no incubation period is observed on the hydroxyl-terminated (—OH) surfaces of the dielectric material 101.

After the exposure to a hydrogen gas ($H_2$) excited by a plasma source, the substrate 2 may be further processed as described above in reference to FIGS. 2C-2D to form a laminate containing a $SiO_2$ film 113 on a metal oxide film 111. In one example, the metal oxide film 111 may be deposited by an ALD process that is periodically interrupted by an exposure to a hydrogen gas ($H_2$) excited by a plasma source, in order to improve the deposition selectivity of the metal oxide film 111 on the dielectric material 101.

Figure 3:
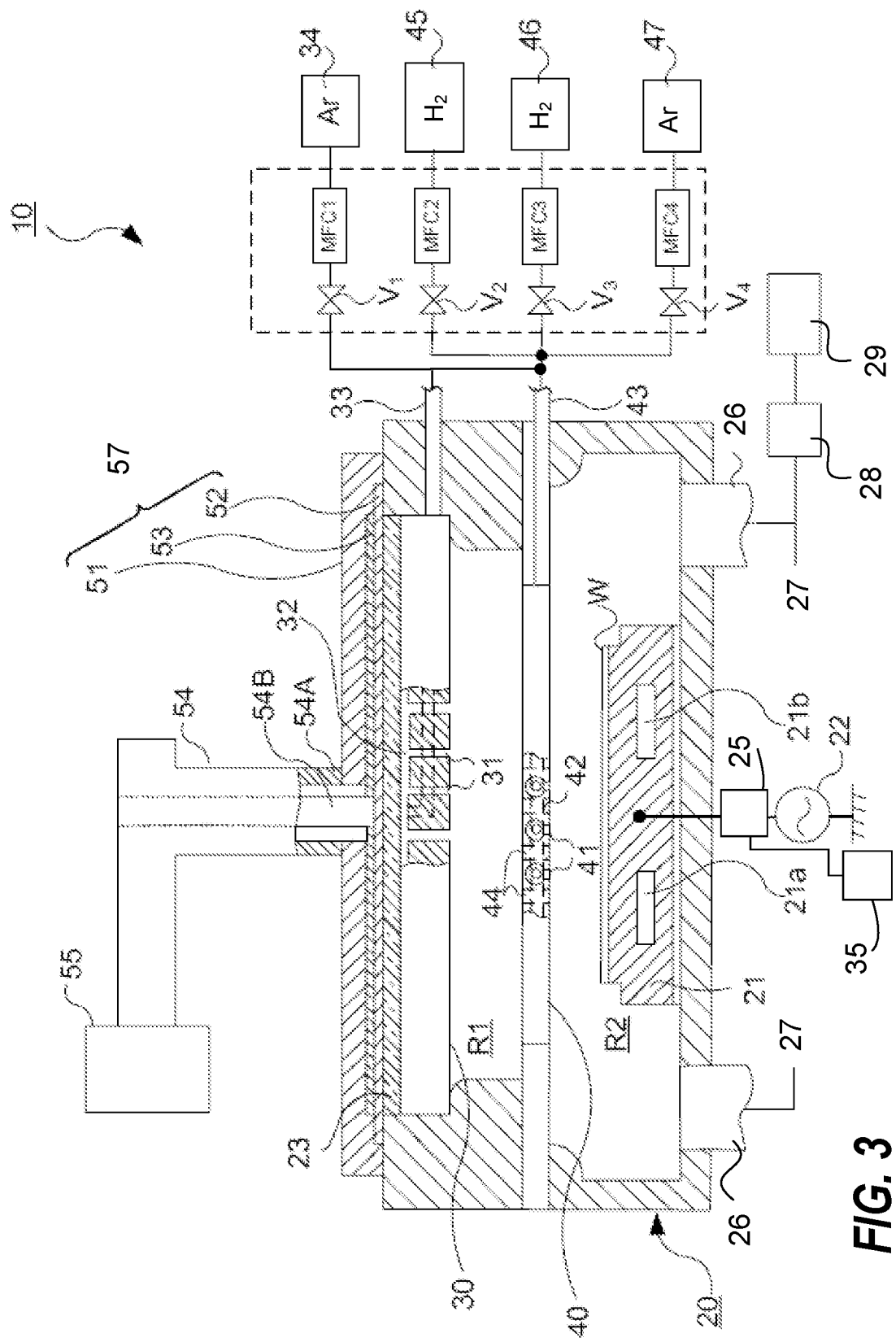
FIGS. 3-5 are schematic diagrams of a plasma processing system containing a RLSA™ plasma system for pretreating a substrate with $H_2$ gas according to an embodiment of the invention.

FIG. 3 is a schematic diagram of a plasma processing system containing a RLSA™ plasma system for pretreating a substrate with $H_2$ gas according to an embodiment of the invention. As shown in this figure, plasma processing system 10 includes a plasma processing chamber 20 (vacuum chamber), an antenna unit 57, and a substrate holder 21. The interior of the plasma processing chamber 20 is roughly sectionalized into a plasma generation region R1, located below a plasma gas supply unit 30, and a plasma diffusion region R2 at the substrate holder 21 side. The plasma generated in the plasma generation region R1 can have an electron temperature of several electron volts (eV). When the plasma is diffused into the plasma diffusion region R2, wherein the film formation process is performed, the electron temperature of the plasma near the substrate holder 21 drops to a value of lower than about 2 eV. The substrate holder 21 is located centrally on a bottom portion of the plasma processing chamber 20 and serves as a mounting unit for mounting a substrate W. Within the substrate holder 21, there is provided an insulating member 21a, a cooling jacket 21b, and a temperature control unit, not shown in this figure, for controlling the substrate temperature.

A top portion of the plasma processing chamber 20 is open-ended. The plasma gas supply unit 30 is placed opposite to the substrate holder 21 and is sealed with the top portion of the plasma processing chamber 20 via sealing members, not shown in this figure, such as O rings. The plasma gas supply unit 30, which may also function as a dielectric window, is made of materials such as aluminum oxide or quartz, and its planar surface, which has a virtual disk shape, faces the substrate holder 21. A plurality of gas supply holes 31 are provided opposite to the substrate holder 21 on the planar surface of the plasma gas supply unit 30. The plurality of gas supply holes 31 communicate with a plasma gas supply port 33 via a gas flow channel 32. Plasma gas supply sources 34, 45, 46, 47 provide plasma gas such as $H_2$ gas and Ar gas into the plasma gas supply port 33. The plasma gas is then uniformly supplied into the plasma generation region R1 via the plurality of gas supply holes 31.

The plasma processing system 10 further includes a process gas supply unit 40, which is located substantially at the center of the plasma processing chamber 20 between the plasma generation region R1 and the plasma diffusion region R2. The process gas supply unit 40 is made of conducting materials such as aluminum alloy including magnesium (Mg) or stainless steel. Similar to the plasma gas supply unit 30, a plurality of gas supply holes 41 are provided on a planar surface of the process gas supply unit 40. The planar surface of the process gas supply unit 40 is positioned opposite to the substrate holder 21 and has a disk shape.

The plasma processing chamber 20 further includes exhaust lines 26 connected to the bottom portion of the plasma processing chamber 20, a vacuum line 27 connecting the exhaust line to a pressure controller valve 28 and to a vacuum pump 29. The pressure controller valve 28 may be used to achieve a desired gas pressure in the plasma processing chamber 20.

Figure 4:
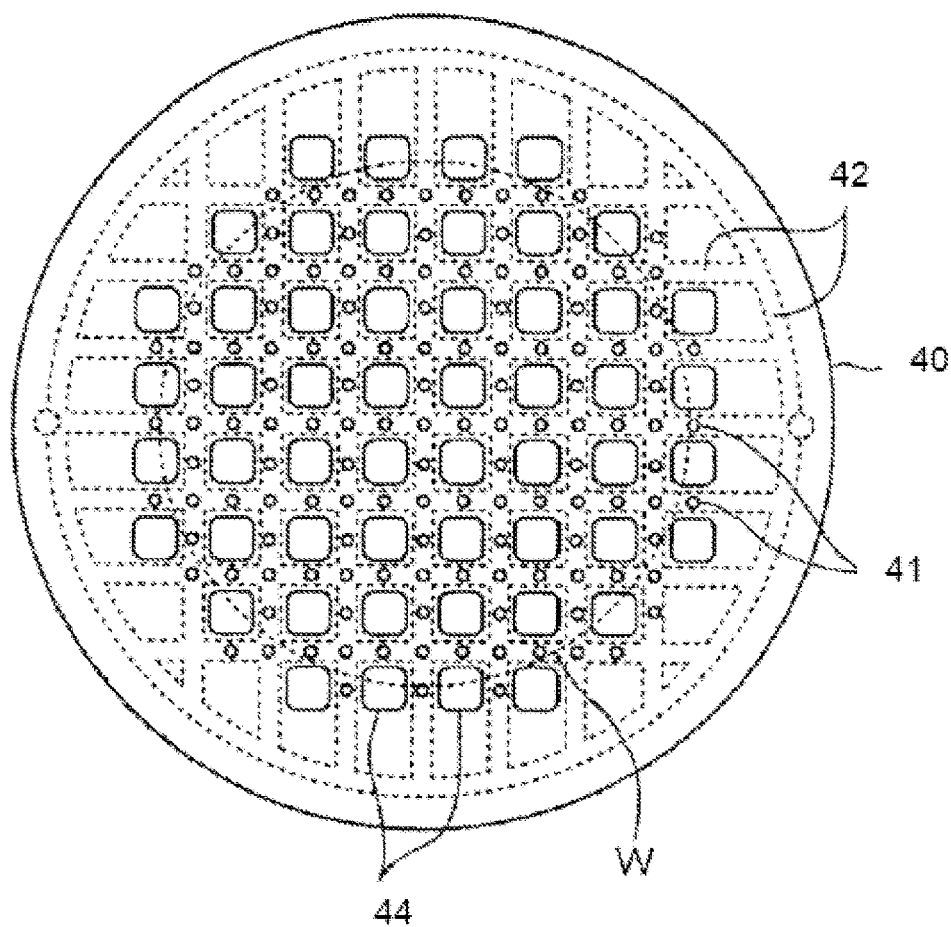

A plan view of the process gas supply unit 40 is shown in FIG. 4. As shown in this figure, a grid-like gas flow channel 42, also called a shower plate, is formed within the process gas supply unit 40. The grid-like gas flow channel 42 communicates with an upper-end of the plurality of gas supply holes 41, which are formed in the vertical direction. The lower end of the plurality of gas supply holes 41 are openings facing the substrate holder 21. The plurality of gas supply holes 41 communicate with a process gas supply port 43 via the grid-patterned gas flow channel 42.

Further, a plurality of openings 44 are formed on to the process gas supply unit 40 such that the plurality of openings 44 pass through the process gas supply unit 40 in vertical direction. The plurality of opening 44 passes the plasma gas, e.g., $H_2$ gas and optionally Ar gas, into the plasma diffusion region R2 on the side of the substrate holder 21. As shown in FIG. 4, the plurality of openings 44 are formed between the adjacent gas flow channels 42. The process gas is supplied, for example, from separate process gas supply sources 45 and 46 to the process gas supply port 43. According to some embodiments, any combination of $H_2$ and Ar may be flowed through the process gas supply unit 40 and/or through the plasma gas supply port 33. Furthermore, for example, the plurality of openings 44 may occupy a region on the process gas supply unit 40 that extends beyond a peripheral edge of the substrate W.

The process gas flows through the grid-like gas flow channel 42 and are uniformly supplied into the plasma diffusion region R2 via the plurality of gas supply holes 41.

The plasma processing system 10 further includes four valves (V1-V4) and four flow rate controller (MFC1-MFC4) for respectively controlling a supply of the gases into the plasma processing chamber 20.

An external microwave generator 55 provides a microwave signal (or microwave energy) of a predetermined frequency, e.g., 2.45 GHz, to the antenna unit 57 via a coaxial waveguide 54. The coaxial waveguide 54 may include an inner conductor 54B and an outer conductor 54A. The microwave from the microwave generator 55 generates an electric field just below the plasma gas supply unit 30, in the plasma generation region R1, which in turn causes excitation of the process gas within the plasma processing chamber 20.

Figure 5:
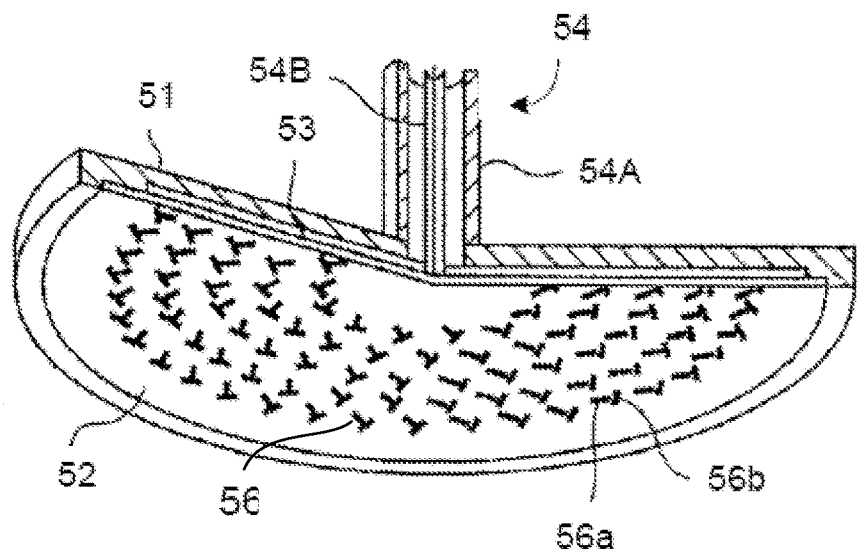

FIG. 5 illustrates a partial cross-sectional view of the antenna unit 57. As shown in this figure, the antenna unit 57 may include a flat antenna main body 51, a radial line slot plate 52, and a dielectric plate 53 to shorten the wavelength of the microwave. The flat antenna main body 51 has a circular shape with an open-ended bottom surface. The radial line slot plate 52 is formed to close the open-ended bottom surface of the flat antenna main body 51. The flat antenna main body 51 and the radial line slot plate 52 are made of a conductive material with a flat hollowed circular shape waveguide.

A plurality of slots 56 is provided on the radial line slot plate 52 to generate a circular polarized wave. The plurality of slots 56 is arranged in a substantially T-shaped form having a slight gap there between, in a concentric circle pattern or a spiral pattern along a circumferential direction. Since the slots 56a and 56b are perpendicular to each other, a circular polarized wave containing two orthogonal polarized components is radiated, as a plane wave, from the radial line slot plate 52.

The dielectric plate 53 is made of a low loss dielectric material, e.g., aluminum oxide ($Al_2O_3$) or silicon nitride ($Si_3N_4$), which is located between the radial line slot plate 52 and the flat antenna main body 51. The radial line slot plate 52 is mounted on the plasma processing chamber 20 using sealing members (not shown), such that the radial line slot plate 52 is in close contact with a cover plate 23. The cover plate 23 is located on the upper surface of plasma gas supply unit 30 and is formed from a microwave transmissive dielectric material such as aluminum oxide ($Al_2O_3$).

An external high-frequency power supply source 22 is electrically connected to the substrate holder 21 via a matching network 25. The external high-frequency power supply source 22 generates an RF bias power of a predetermined frequency, e.g. 13.56 MHz, for controlling ions energy that are drawn to the substrate W. The power supply source 22 is further configured to optionally provide pulsing of the RF bias power the pulsing frequency can be greater than 1 Hz, for example 2 Hz, 4 Hz, 6 Hz, 8 Hz, 10 Hz, 20 Hz, 30 Hz, 50 Hz, or greater. The power supply source 22 is configured for supplying RF bias power can be between 0 W and 100 W, between 100 W and 200 W, between 200 W and 300 W, between 300 W and 400 W, or between 400 W and 500 W. It is noted that one skilled in the art will appreciate that the power levels of the power supply source 22 are related to the size of the substrate being processed. For example, a 300 mm Si wafer requires greater power consumption than a 200 mm wafer during processing. The plasma processing system 10 further includes DC voltage generator 35 capable of supplying DC voltage bias between about −5 kV and about +5 kV to the substrate holder 21.

During the plasma exposure, the plasma gas, e.g., $H_2$ gas and optionally Ar gas, may be introduced into the plasma processing chamber 20 using the plasma gas supply unit 30. On the other hand, the process gas may be introduced into the plasma processing chamber 20 using the process gas supply unit 40.

Methods for selective film deposition using a surface pretreatment have been disclosed in various embodiments. The foregoing description of the embodiments of the invention has been presented for the purposes of illustration and description. It is not intended to be exhaustive or to limit the invention to the precise forms disclosed. This description and the claims following include terms that are used for descriptive purposes only and are not to be construed as limiting. Persons skilled in the relevant art can appreciate that many modifications and variations are possible in light of the above teaching. Persons skilled in the art will recognize various equivalent combinations and substitutions for various components shown in the Figures. It is therefore intended that the scope of the invention be limited not by this detailed description, but rather by the claims appended hereto.

What is claimed is:

1. A substrate processing method, comprising:
providing a substrate containing a dielectric material, a metal layer, and an oxidized metal layer on the metal layer;
exposing the substrate to a reactant gas containing a molecule that forms self-assembled monolayers (SAMs) on the substrate;
selectively depositing a metal oxide film on the dielectric material relative to the oxidized metal layer by exposing the substrate to a deposition gas; and
exposing the substrate to a process gas containing a silanol gas for a time period that selectively deposits a $SiO_2$ film on the metal oxide film.

2. The method of claim 1, wherein the metal layer contains Cu, Ru, Co, or W, and the oxidized metal layer contains oxidized Cu, oxidized Ru, oxidized Co, or oxidized W.

3. The method of claim 1, wherein the molecule includes a head group, a tail group, and a functional end group, and wherein the head group includes a thiol, a silane, or a phosphonate.

4. The method of claim 1, wherein the molecule includes perfluorodecyltrichlorosilane $(CF_3(CF_2)_7CH_2CH_2SiCl_3)$, perfluorodecanethiol $(CF_3(CF_2)_7CH_2CH_2SH)$, chlorodecyldimethylsilane $(CH_3(CH_2)_8CH_2Si(CH_3)_2Cl)$, or tert-butyl(chloro)dimethylsilane $((CH_3)_3CSi(Cl)(CH_3)_2))$.

5. The method of claim 1, wherein the metal oxide film contains $HfO_2$, $ZrO_2$, or $Al_2O_3$.

6. The method of claim 1, wherein the exposing the substrate to the process gas containing the silanol gas is performed in the absence of any oxidizing and hydrolyzing agent at a substrate temperature of approximately 150° C., or less.

7. The method of claim 1, wherein the silanol gas is selected from the group consisting of tris(tert-pentoxy) silanol, tris(tert-butoxy) silanol, and bis(tert-butoxy)(isopropoxy) silanol.

8. The method of claim 1, further comprising:
repeating the exposing the substrate to a reactant gas, selectively depositing a metal oxide film, and exposing the substrate to a process gas containing a silanol gas at least once in order to increase a thickness of the metal oxide film and the $SiO_2$ film on the dielectric material.

9. The method of claim 1, wherein the dielectric material surrounds the metal layer.

10. A substrate processing method, comprising:
providing a substrate containing a dielectric material and a metal layer, the metal layer having an oxidized metal layer thereon, wherein the metal layer contains Cu, Ru, Co, or W, and the oxidized metal layer contains oxidized Cu, oxidized Ru, oxidized Co, or oxidized W;
exposing the substrate to a reactant gas containing a molecule that forms self-assembled monolayers (SAMs) on the substrate, wherein the molecule includes a head group, a tail group, and a functional end group, and wherein the head group includes a thiol, a silane, or a phosphonate;
selectively depositing a metal oxide film on the dielectric material relative to the oxidized metal layer by exposing the substrate to a deposition gas;
exposing the substrate to a process gas containing a silanol gas for a time period that selectively deposits a $SiO_2$ film on the metal oxide film; and
repeating the exposing the substrate to a reactant gas, selectively depositing a metal oxide film, and exposing the substrate to a process gas containing a silanol gas at least once in order to increase a thickness of the metal oxide film and the $SiO_2$ film on the dielectric material.

11. A substrate processing method, comprising:
providing a substrate containing a dielectric material and a metal layer, the metal layer having an oxidized metal layer thereon;
exposing the substrate to hydrogen ($H_2$) gas excited by a plasma source;
selectively depositing a metal oxide film on the dielectric material relative to the oxidized metal layer by exposing the substrate to a deposition gas; and
exposing the substrate to a process gas containing a silanol gas for a time period that selectively deposits a $SiO_2$ film on the metal oxide film.

12. The method of claim 11, wherein the metal layer contains Cu, Ru, Co, or W, and the oxidized metal layer contains oxidized Cu, oxidized Ru, oxidized Co, or oxidized W.

13. The method of claim 11, wherein the exposing the substrate to the hydrogen gas excited by the plasma source forms a hydrogen-termination on the oxidized metal layer.

14. The method of claim 11, further comprising:
removing the oxidized metal layer from the metal layer; and
selectively depositing the metal oxide film on the dielectric material relative to the metal layer by exposing the substrate to a deposition gas.

15. The method of claim 11, wherein the removing includes a chemical oxide removal (COR) process.

16. The method of claim 11, wherein the metal oxide film contains $HfO_2$, $ZrO_2$, or $Al_2O_3$.

17. The method of claim 11, wherein the exposing the substrate to the process gas containing the silanol gas is performed in the absence of any oxidizing and hydrolyzing agent at a substrate temperature of approximately 150° C., or less.

18. The method of claim 11, wherein the silanol gas is selected from the group consisting of tris(tert-pentoxy) silanol, tris(tert-butoxy) silanol, and bis(tert-butoxy)(isopropoxy) silanol.

19. The method of claim 11, further comprising:
repeating the exposing the substrate to hydrogen ($H_2$) gas excited by a plasma source, selectively depositing a metal oxide film, and exposing the substrate to a process gas containing a silanol gas at least once in order to increase a thickness of the metal oxide film and the $SiO_2$ film on the dielectric material.

20. The method of claim 11, wherein the dielectric material surrounds the metal layer.

* * * * *